United States Patent
LaBrake et al.

(10) Patent No.: US 10,859,913 B2
(45) Date of Patent: Dec. 8, 2020

(54) SUPERSTRATE AND A METHOD OF USING THE SAME

(71) Applicant: CANON KABUSHIKI KAISHA, Tokyo (JP)

(72) Inventors: Dwayne L. LaBrake, Cedar Park, TX (US); Niyaz Khusnatdinov, Round Rock, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/737,362

(22) Filed: Jan. 8, 2020

(65) Prior Publication Data

US 2020/0142300 A1    May 7, 2020

Related U.S. Application Data

(62) Division of application No. 15/896,756, filed on Feb. 14, 2018, now Pat. No. 10,606,171.

(51) Int. Cl.
*H01L 21/311* (2006.01)
*H01L 21/3105* (2006.01)
(Continued)

(52) U.S. Cl.
CPC ........ *G03F 7/0002* (2013.01); *G03F 7/70483* (2013.01); *H01L 21/308* (2013.01);
(Continued)

(58) Field of Classification Search
None
See application file for complete search history.

(56) References Cited

U.S. PATENT DOCUMENTS 7,241,395 B2    7/2007  Sreenivasan et al.
8,394,282 B2    3/2013  Panga et al.
(Continued)

FOREIGN PATENT DOCUMENTS

JP    2011529626 A    12/2011

OTHER PUBLICATIONS

Japanese Office Action for JP2019022955, dated Jan. 6, 2020, 4 pages.

*Primary Examiner* — Stephanie P Duclair
(74) *Attorney, Agent, or Firm* — Abel Schillinger, LLP

(57) ABSTRACT

A body of a superstrate can be used to form an adaptive planarization layer over a substrate that has a non-uniform topography. A body of a superstrate can have bending characteristics that are well suited to achieve both conformal and planarization behavior. The body can have a surface and a thickness in a range of $t_1$ to $t_2$, $t_1=(Pd^4/2Eh)^{1/3}$; $t_2=(5Pd^4/2Eh)^{1/3}$; P is a pressure corresponding to a capillary force between the body and a planarization precursor material; d is a bending distance; E is Young's modulus for the body; and h is a step height difference between two adjacent regions of a substrate. In an embodiment, a thickness can be selected and used to determine the maximum out-of-plane displacement, $w_{max}$, for conformal behavior is sufficient and that $w_{max}$ for planarization behavior is below a predetermined threshold.

19 Claims, 6 Drawing Sheets

(51) Int. Cl.
  *H01L 21/308*  (2006.01)
  *H01L 21/3065*  (2006.01)
  *G03F 7/20*  (2006.01)
  *G03F 7/00*  (2006.01)
  *C03C 17/42*  (2006.01)

(52) U.S. Cl.
  CPC ...... *H01L 21/3065* (2013.01); *H01L 21/3081* (2013.01); *H01L 21/311* (2013.01); *H01L 21/31051* (2013.01); *H01L 21/31111* (2013.01); *H01L 21/31116* (2013.01)

(56) References Cited

U.S. PATENT DOCUMENTS

| | | |
|---|---|---|
| 9,415,418 B2 | 8/2016 | Sreenivasan et al. |
| 9,514,950 B2 | 12/2016 | Ye et al. |
| 2015/0048050 A1 | 2/2015 | Sreenivasan et al. |
| 2017/0106399 A1 | 4/2017 | Sreenivasan et al. |
| 2017/0140921 A1 | 5/2017 | Khusnatdinov et al. |

SUPERSTRATE AND A METHOD OF USING THE SAME

CROSS-REFERENCE TO RELATED APPLICATIONS

This application is a divisional of and claims priority under 35 U.S.C. § 120 to U.S. patent application Ser. No. 15/896,756, entitled "SUPERSTRATE AND A METHOD OF USING THE SAME," by Dwayne L. LaBrake et al., filed Feb. 14, 2018, which is a non-provisional application incorporated herein by reference in its entirety.

FIELD OF THE DISCLOSURE

The present disclosure relates to superstrates used in planarization layers over substrates.

RELATED ART

An adaptive imprint planarization process is disclosed in U.S. Pat. No. 8,394,282. Adaptive imprint planarization provides a surface having desired shape characteristics. Generally, topography of a first surface is mapped to provide a density map. The density map is evaluated to provide a drop pattern for dispensing polymerizable material on the first surface. The polymerizable material is solidified and etched to provide a second surface of a template, wherein the second surface has the desired shape characteristics. Additionally, adaptive imprint planarization compensates for parasitic effects of the imprinting process.

Reverse tone patterning can be used on surfaces having planarity perturbations. U.S. Pat. No. 7,241,395 discloses a method of patterning a substrate that includes forming, on the substrate, a first film having an original pattern that includes a plurality of projections a subset of which extends from a nadir surface terminating in an apex surface defining a height therebetween. A second film is disposed upon the first film and defines a surface spaced-apart from the apex surface of the plurality of projections. A variation in a distance between the apex surface of any one of the plurality of projections and the surface being within a predetermined range. A recorded pattern is transferred onto the substrate that corresponds to the original pattern, within the predetermined range being selected to minimize pattern distortions in the recorded pattern.

SUMMARY

In an aspect, a superstrate can include a body having a surface and a thickness in a range of $t_1$ to $t_2$, wherein $t_1=(Pd^4/2Eh)^{1/3}$, $t_2=(5Pd^4/2Eh)^{1/3}$, P is a pressure corresponding to a sum of contributions from a capillary force between the body and formable precursor material, and a gas pressure applied to the superstrate, d is a bending distance, E is Young's modulus for the body, and h is a step height difference between two adjacent regions of a substrate.

In an embodiment, the superstrate has a conformal behavior area that has an out-of-plane displacement of at least 5 nm.

In a particular embodiment, the conformal behavior area has a length of at least 0.20 mm.

In another embodiment, the superstrate has a planarizing behavior area that has an out-of-plane displacement of at most 1 nm.

In a particular embodiment, the planarizing behavior area has a bending distance of at most 0.1 mm.

In still another embodiment, the body includes a glass.

In yet another embodiment, the body includes a polymer.

In another embodiment, the body has a transmittance greater than 70% for radiation used to polymerize a planarization precursor material that is used to form a planarization layer.

In another aspect, a method of fabricating a superstrate can include removing a portion of a material to define a body of the substrate, wherein the body has a thickness that is a function of Young's modulus of the body, a distance between steps, and a step height difference between two adjacent regions of a substrate.

In an embodiment, the body includes glass and has a thickness in a range of 0.20 mm to 0.95 mm, or the body includes polyethylene and has a thickness in a range of 0.25 mm to 1.1 mm.

In a further aspect, a method can be used to manufacture an article. The method can include dispensing a planarization precursor material over a substrate, wherein the substrate includes a non-uniform surface topography; contacting the planarization precursor material with a body of a superstrate, wherein the body has a surface and a thickness in a range of $t_1$ to $t_2$, wherein $t_1=(Pd^4/2Eh)^{1/3}$, $t_2=(5Pd^4/2Eh)^{1/3}$, P is a pressure corresponding to a sum of contributions from a capillary force between the body and formable precursor material, and a gas pressure applied to the superstrate, d is a bending distance, E is Young's modulus for the body, and h is a step height difference between two adjacent regions of a substrate; and polymerizing the planarization precursor material to form a planarization layer over the substrate, wherein curing is performed while the superstrate is contacting the planarization precursor material.

In another embodiment, the method further includes forming a patterned resist layer including protrusions and a residual layer, wherein forming the patterned resist layer is performed before dispensing the planarization precursor material.

In a particular embodiment, forming the patterned resist layer comprises dispensing a resist precursor material; contacting the resist precursor material with a template; and polymerizing the resist precursor material to form patterned resist layer.

In a more particular embodiment, the template has an area of at most 50 cm$^2$.

In another more particular embodiment, the planarization precursor material and the resist precursor material are different materials.

In a still another embodiment, the method further includes forming a hardmask layer over the patterned resist layer before dispensing the planarization precursor material.

In a particular embodiment, the method further includes etching the planarization layer to expose top portions of hardmask layer.

In a more particular embodiment, the method further includes etching exposed top portions of hardmask layer to exposed portions of the patterned resist layer.

In an even more particular embodiment, the method further includes etching the exposed portions of patterned resist layer.

In a further embodiment, the planarization precursor material is a spin-on carbon.

BRIEF DESCRIPTION OF THE DRAWINGS

Embodiments are illustrated by way of example and are not limited in the accompanying figures.

Figure 1:
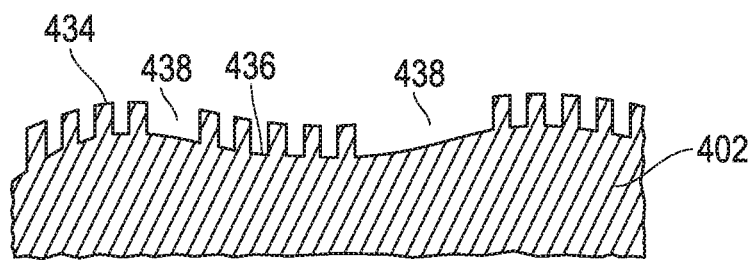
FIG. 1 depicts a generic example of substrate with short scale topography (pattern) and long scale topography.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

A body of a superstrate can be designed to be useful in forming an adaptive planarization layer over a substrate that has a non-uniform topography. As used herein, adaptive planarization refers to planarization that is conformal over a relatively longer scale and planar over a relatively shorter scale. In a non-limiting embodiment, the relatively longer scale may be at least an order of magnitude larger than the relatively shorter scale. In another embodiment, the relatively longer scale may be at least 5 microns, and the relatively shorter scale may be at most 0.5 micron. A body of a superstrate can have bending characteristics that are well suited to achieve both conformal and planarization behavior. The body can have a thickness in a range of $t_1$ to $t_2$, wherein $t_1=(Pd^4/2Eh)^{1/3}$, $t_2=(5Pd^4/2Eh)^{1/3}$, P is a pressure corresponding to a sum of contributions from a capillary force between the body and formable precursor material, and a gas pressure applied to the superstrate; d is a bending distance, E is Young's modulus for the body, and h is a step height difference between two adjacent regions of a substrate.

Equations provided herein can be used to ensure the maximum out-of-plane displacement for conformal behavior is the same or greater than a height difference along a substrate or a residual layer thickness of a patterned layer and to provide a range of thicknesses for the particular material of the body. In an embodiment, a thickness can be selected and used to determine that the maximum out-of-plane displacement $w_{max}$ for conformal behavior is sufficient and that $w_{max}$ for planarization behavior is below a predetermined threshold. The thickness may be adjusted until the values for $w_{max}$ are acceptable. The length L can be used to determine the bending distance d that can be used in equations to determine the range of thicknesses that can be used. Other techniques may be used to determine the range of thicknesses for a body.

Details regarding the superstrate and methods of using the superstrate are better understood after reading this specification in conjunction with figures. The description below is meant to illustrate embodiments and not limit the scope of the present invention, which is defined in the appended claims.

FIGS. 1 to 4 are provided to provide context on how an adaptive planarization layer is formed before addressing design considerations for a body of a superstrate. The non-planar exposed surface of a workpiece causes difficulty in properly forming a reverse tone etch mask if a flat planarization layer surface extends over a long distance scale. The superstrate is designed to allow the planarization layer to be formed with a thickness that is more uniform over the relatively higher and relatively lower elevations of the substrate 12.

Figure 2:
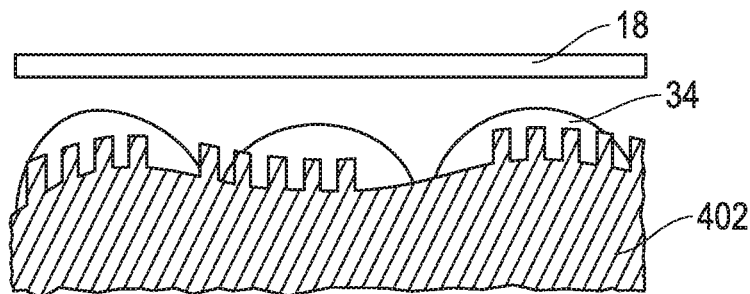
FIG. 2 illustrates a planarization precursor material dispensed on the substrate of FIG. 1.
Figure 3:
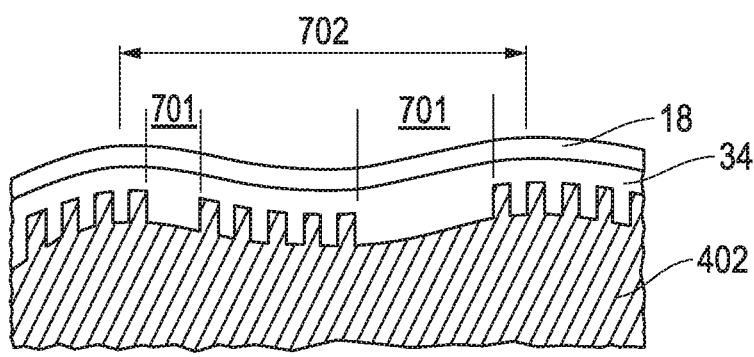
FIG. 3 illustrates the superstrate in contact with planarization precursor material.
Figure 4:
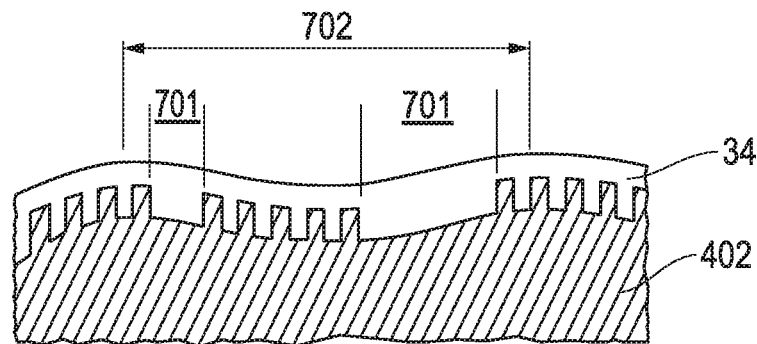
FIG. 4 illustrates a resulting adaptive planarization layer that is planarized on a short length scale and formed in a conformal fashion with uniform average thickness layer on a long length scale.

FIG. 1 depicts schematically an example of a substrate 402 having an exposed surface with protrusions 434, relatively narrower recessions 436, and relatively wider recessions 438. Thus, the substrate 402 has short scale topography corresponding to the pattern with protrusions 434 and recessions 436 and 438 and a long scale topography illustrated as a wavy surface. FIG. 2 illustrates a planarization precursor material 34 dispensed on the substrate 402. The superstrate 18 is located in the proximity to the planarization precursor material 34 and the substrate 402. FIG. 3 illustrates schematically the superstrate 18 after it comes in contact with planarization precursor material 34 and the substrate 402. The superstrate 18 is conformal on a long scale length 702 and planarizing on a short scale length 701. FIG. 4 illustrates the substrate 402 and the workpiece after the imprint process is done. The substrate 402 is planarized on a short length scale 701 and coated in a conformal fashion on a long length scale 702. As described below, the body of the superstrate 18 has an appropriate thickness for a particular material of the body in order to achieve the proper performance in view of both the short length scale 701 and the long length scale 702.

Figure 5:
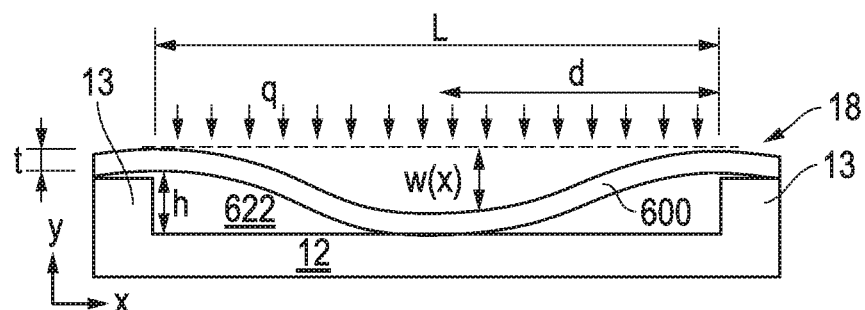
FIG. 5 includes an illustration of a model used to characterize conformal behavior.
Figure 6:
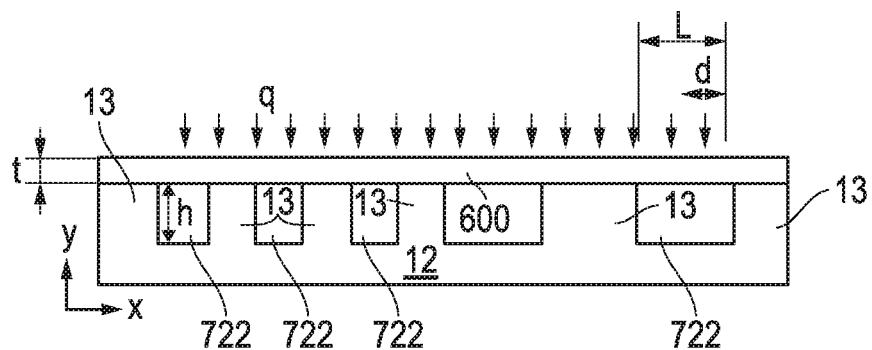
FIG. 6 includes an illustration of a model used to characterize planarization behavior.

When forming an adaptive planarization layer, a body 600 of the superstrate 18 exhibits conformal behavior, as illustrated in FIG. 5, and planarization behavior, as illustrated in FIG. 6. The changes in topography of the substrate 12 are modeled as steps 13. The conformal behavior allows the body 600 to conform to a relatively larger spacing 622 between portions of the substrate 12 corresponding to steps without extending too far into the relatively narrower spacings 722. Referring to FIG. 3, the conformal behavior is more significant with respect to the relatively longer length scale 702, and the planarization behavior is more significant with respect to the relatively narrower recessions 436 and relatively wider recessions 438.

Referring to FIG. 5, the relatively larger spacing 622 has a length L, and a corresponding bending distance d is L/2. The body 600 has thickness t. After the superstrate 18 contacts a planarization precursor material, the superstrate 18 experiences a force per unit of length along bending direction, q, applied uniformly along the body 600. The force q is a combination of capillary force and force exerted on the superstrate by air or gas. The capillary force can be a function of the materials of the superstrate 18 and the planarization precursor material. In the equations below, a pressure P corresponds to the capillary force and is estimated at $1.32 \times 10^6$ N/m$^2$ or 13 atmospheres. As seen in FIG. 5, the body 600 has an out-of-plane displacement w(x).

Referring to FIG. 6, the planarization behavior allows the body 600 to remain relatively planar over relatively smaller spacings 722 between portions of the substrate 12 corresponding to steps. The length L for the conformal behavior in FIG. 5 is much larger than each of the lengths L of the relatively smaller spacings 722 corresponding to the planarization behavior. For example, the length L for the conformal behavior can be at least an order of magnitude greater than L for relatively smaller spacings 722 corresponding to planarization behavior.

The material and thickness of the body 600 of the superstrate 18 are selected to give a desired performance for both conformal and planarization behaviors. For a particular material for the body 600, different thicknesses can be used to determine bending distances d and maximum out-of-plane displacements $w_{max}$ for the relatively larger spacing 622 and representative relatively smaller spacings 722. The description below, including the equations, is applicable to many different materials for the body 600.

Figure 7:
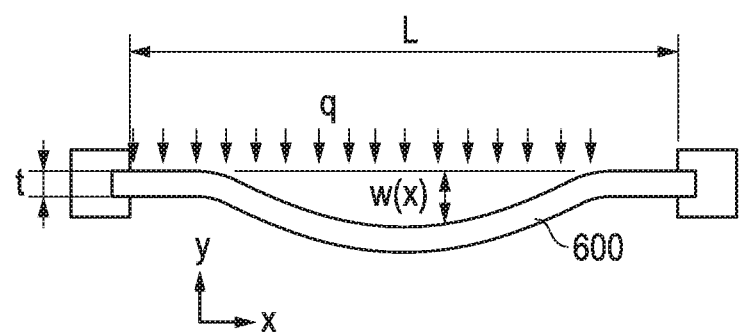
FIG. 7 includes an illustration a side view of a body of the superstrate when modeled as a thin beam bending between fixed ends.
Figure 8:
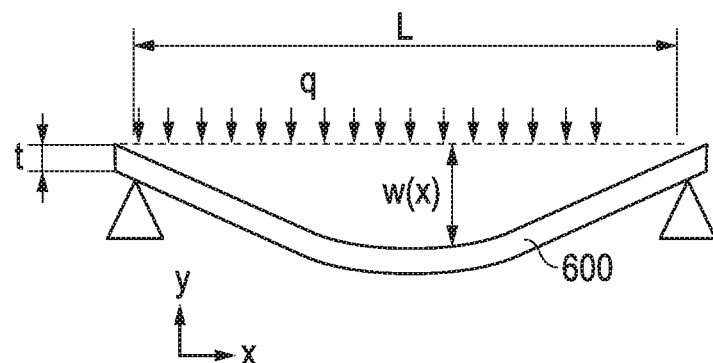
FIG. 8 includes an illustration a side view of the body of the superstrate when modeled as a thin beam bending on two support points.

Two different models can be used to determine characteristics of the body 600. FIG. 7 includes an illustration in which the body 600 of the superstrate 18 is modeled as a thin beam bending with fixed ends. FIG. 8 includes an illustration in which the body 600 of the superstrate 18 is modeled as a thin beam bending on two support points.

The maximum out-of-plane displacement $w_{max}$ is at the midpoint between the steps and is determined by Equation 1.

$$w_{max} = qL^4/AEI = 12q\ L^4/AEbt^3 = 12PL^4/AEt^3 \quad \text{(Equation 1)}$$

where moment of inertia I of a thin beam is $bt^3/12$
t is the thickness of the body 600 of the superstrate 18
b is the beam width in perpendicular direction L is the length between the support points,
A is 384 for the fixed-ends model (FIG. 7) and 384/5, or 76.8, for the two support points model (FIG. 8)
q is the load (force per unit length in x-direction) uniformly applied to the beam between the fixed ends (FIG. 7) or the support points (FIG. 8).
P=q/b is a pressure applied uniformly to the beam. Pressure is convenient parameter that is easier to measure and eliminates a need for parameter b.
E is Young's modulus for the body 600 of the superstrate 18;

Using Equation 1 and pre-determined out-plane deviation w(x) equal to the step height h, the length L between the steps (support points) is expressed by Equation 2.

$$L = 2d = (AEbht^3/12q)^{1/4} = (AEht^3/12P)^{1/4} \quad \text{(Equation 2)}$$

where,
the bending distance d is L/2.

Thus, a thickness t can be selected, and using Equations 1 and 2, the maximum out-of-plane deviation $w_{max}$ can be estimated. For conformal behavior, $w_{max}$ can be at least as large as the step height h. The $w_{max}$ can be at least the value of the height difference that corresponds to elevational differences in the substrate, thickness differences of the residual layer thickness of the patterned layer, or a combination of the elevational and thickness differences. For planarization behavior, $w_{max}$ should be small. Note that the value for L for conformal behavior is much larger than L for planarization behavior. In a particular embodiment, $w_{max}$ for conformal behavior may be at least 5 nm, and for the relatively smaller spacings 722, the $w_{max}$ for planarization behavior may be less than 1 nm or even less than 0.1 nm. The particular values are dependent on the step height, h, and therefore, skilled artisans will understand that the preceding values are exemplary and do not limit the scope of the concepts as described herein.

In an embodiment, the two models can be used to determine minimum and maximum thicknesses for the body 600 of the superstrate 18 after a material of the body 600 is selected.

For the model as illustrated in FIG. 7, $t_1$ is determined by Equation 3.

$$t_1 = (Pd^4/2Eh)^{1/3} \quad \text{(Equation 3)}$$

where
$t_1$ is the thickness of the body 600 of the superstrate 18; and
P is a pressure corresponding to a sum of contributions from the capillary force between the body 600 and the planarization precursor material, and the force originated from air or other gas pressure applied to the superstrate 18.

For the model as illustrated in FIG. 8, $t_2$ is determined by Equation 4.

$$t_2 = (5Pd^4/2Eh)^{1/3} \quad \text{(Equation 4)}$$

where $t_2$ is the thickness of the body 600 of the superstrate.

A bending distance d is L/2, and L can be determined using Equation 2. Alternatively, referring to FIG. 11, the bending distance can be input using information regarding of the patterned resist layer 422, such widths of recessions 426 and 428. In a particular embodiment, d may be in a range of 0.1 mm to 2 mm for conformal behavior, and d may be 0.03 mm for planarization behavior.

In another embodiment, an iterative process may be used. A value for the thickness t can be used to determine L (using Equation 2) and dividing L by two to obtain the bending distance d. The thickness t can also be used to confirm that $w_{max}$ for conformal behavior is at least as large as the step height and that $w_{max}$ for planarization behavior does not exceed a predetermined value (using Equation 1 for $w_{max}$). Equations 3 and 4 can be used to determine upper and lower limits on the thickness of the body 600.

Data regarding thickness of the body 600, bending distance d, maximum out-of-plane displacement $w_{max}$, and superstrate bending behavior for a glass material is given below. The glass material has a Young's modulus of elasticity of $70 \times 10^9$ N/m². In a particular embodiment, the height difference is 5 nm.

TABLE 1

Glass Superstrate

| Thickness, t (mm) | Bending distance, d (mm) | Maximum out-of-plane displacement, $w_{max}$ (nm) | Superstrate bending behavior |
|---|---|---|---|
| 1.1 | 0.7 | 5.10 | Conformal |
| 1.1 | 0.03 | $1.72 \times 10^{-5}$ | Planarizing |
| 0.3 | 0.27 | 5.57 | Conformal |
| 0.3 | 0.03 | $8.5 \times 10^{-4}$ | Planarizing |
| 0.25 | 0.25 | 7.07 | Conformal |
| 0.25 | 0.03 | $1.5 \times 10^{-3}$ | Planarizing |

For the particular example in Table 1, all of the thicknesses provide an acceptable out-of-plane displacement, as all values of $w_{max}$ for conformal behavior exceed 5 nm. In a particular embodiment, $w_{max}$ for conformal behavior should be high, provided, $w_{max}$ for planarizing behavior is no greater a threshold, such as 1 nm or 0.1 nm. Thus, the body 600 of the superstrate 18 can have a thickness in a range of 0.20 mm to 0.95 mm and provide good bending properties for both conformal and planarization behavior with bending distance in the range between 0.25 mm and 0.7 mm correspondingly. In a particular embodiment, the body 600 can have a thickness of 0.25 mm. In another embodiment, the body 600 of the superstrate 18 may include a polyethylene having a Young's modulus of elasticity of $2 \times 10^9$ N/m². The body 600 made of polyethylene can have a thickness in a range of 0.25 mm to 1.1 mm with bending distance in the range between 0.15 mm and 0.3 mm correspondingly. In a particular embodiment, the body can have a thickness of 0.8 mm. Data for the polyethylene superstrate is listed below in Table 2.

TABLE 2

Polyethylene Superstrate

| Thickness, t (mm) | Bending distance, d (mm) | Maximum out-of-plane displacement, $w_{max}$ (nm) | Superstrate bending behavior |
|---|---|---|---|
| 1.1 | 0.3 | 5.26 | Conformal |
| 1.1 | 0.03 | $6.02 \times 10^{-4}$ | Planarizing |
| 0.8 | 0.23 | 5.41 | Conformal |
| 0.8 | 0.03 | $8.5 \times 10^{-4}$ | Planarizing |
| 0.25 | 0.15 | 5.19 | Conformal |
| 0.25 | 0.03 | $6.42 \times 10^{-3}$ | Planarizing |

After reading this specification, skilled artisans will appreciate that the particular values provided above are merely illustrative to provide a better understanding of how a thickness for the body 600 can be determined to provide good conformal and planarization behavior. Other step heights, other materials for the body 600 of the substrate 18, and other values for parameters can be used without deviating from the concepts as described herein.

A method of fabricating the superstrate can be performed to achieve a body having a desired thickness. As seen with the formulas above, the thickness of the body can be a function of function of Young's modulus of the body, a distance between steps, and a step height difference between two adjacent regions of a substrate. Young's modulus can be obtained from a reference once the material of the body is selected. The distance between steps and the step height can be determined by computer simulation or obtained from cross-sectional images of previously processed substrates (e.g., wafers). In a non-limiting embodiment, the cross-sectional images can be scanning electron microscope micrographs of one or more cleaved wafers at a point in the process after forming the last patterned layer before using the superstrate. In an embodiment where the body includes glass, the body can have a thickness of at least 0.20 mm, at least 0.22 mm, or at least 0.25 mm, and in another embodiment, a thickness of at most 0.95 mm, at most 0.50 mm, or at most 0.35 mm. In an embodiment where the body includes polyethylene, the body can have a thickness of at least 0.25 mm, at least 0.40 mm, or at least 0.50 mm, and in another embodiment, a thickness of at most 0.95 mm, at most 0.90 mm, or at most 0.85 mm.

After the thickness of the body is determined, a piece of transparent or translucent material can be processed to remove a sufficient amount of material of the piece of transparent or translucent material to define the body having the desired thickness. The removal can be performed using machining, etching, another suitable removal technique, or the like. After the removal, the piece of material may have a sufficient thickness around the periphery of the body to allow for handling of the substrate without damaging the body.

Figure 9:
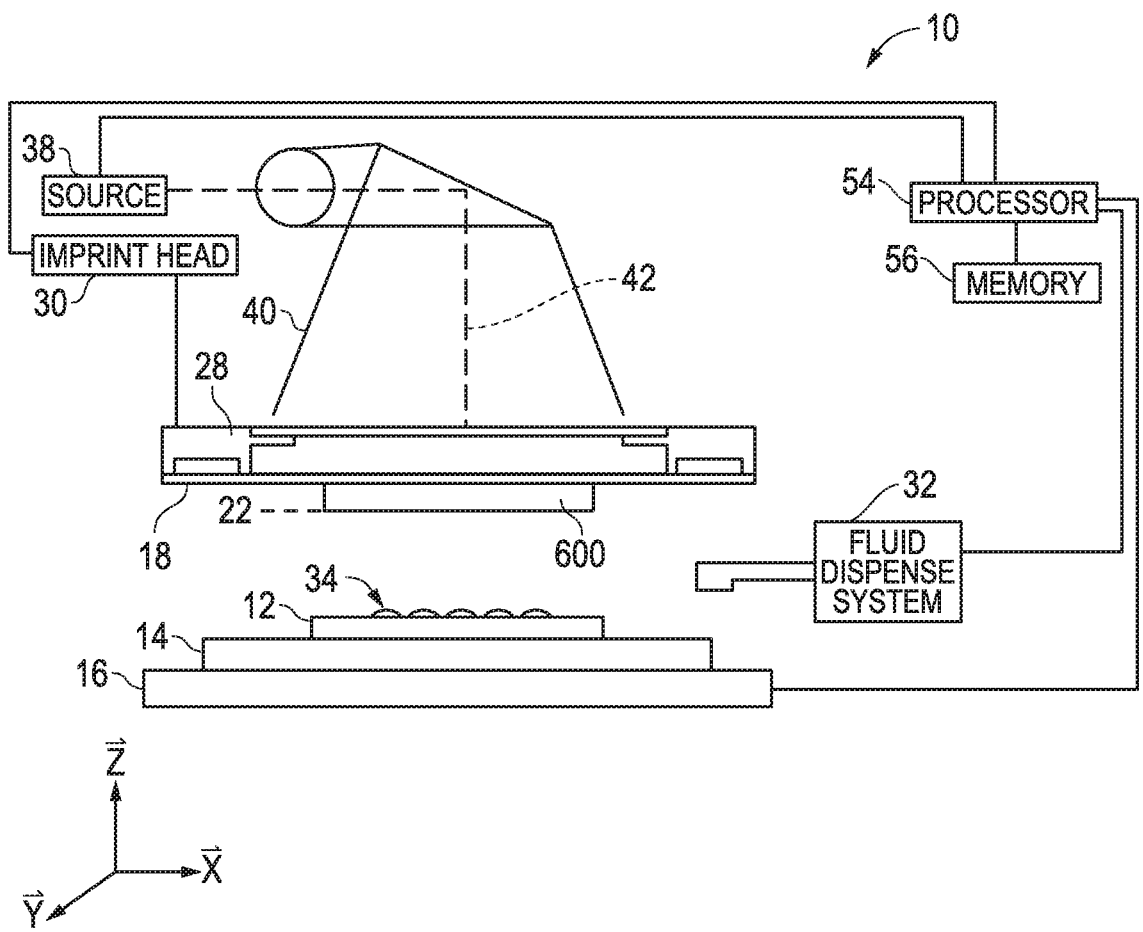
FIG. 9 includes an illustration of a side view of an apparatus that can be used with a superstrate.

Attention is turned to an apparatus 10 that can be used with the superstrate 18, as illustrated in FIG. 9. The apparatus 10 using the superstrate 18 can be used to form an adaptive planarization layer over the substrate 12. The substrate 12 may be coupled to a substrate chuck 14. As illustrated, the substrate chuck 14 is a vacuum chuck; however, in other embodiments the substrate chuck 14 may be any chuck including vacuum, pin-type, groove-type, electrostatic, electromagnetic, or the like. The substrate 12 and substrate chuck 14 may be further supported by a stage 16. The stage 16 may provide translating or rotational motion along the X-, Y-, or Z-directions. The stage 16, substrate 12, and substrate chuck 14 may also be positioned on a base (not illustrated).

Spaced-apart from the substrate 12 is the superstrate 18 having the body 600 that can be used in forming an adaptive planarization layer. More details regarding the superstrate 18 and the body 600 are described above. The superstrate 18 can be coupled to a chuck 28. The chuck 28 can be configured as vacuum, pin-type, groove-type, electrostatic, electromagnetic, or another similar chuck type. In an embodiment, the chuck 28 may be coupled to a head 30 such that the chuck 28 or head 30 can facilitate movement of the superstrate 18.

The apparatus 10 can further include a fluid dispense system 32 used to deposit a planarization precursor material 34 on the substrate 12. For example, the planarization precursor material 34 can include a polymerizable material, such as a resin. The planarization precursor material 34 can be positioned on the substrate 12 in one or more layers using techniques such as droplet dispense, spin-coating, dip coating, chemical vapor deposition (CVD), physical vapor deposition (PVD), thin film deposition, thick film deposition, or combinations thereof. The planarization precursor material 34 can be dispensed upon the substrate 12 before or after a desired volume is defined between the superstrate 18 and the substrate 12, depending on design considerations. For example, the planarization precursor material 34 can include a monomer mixture that can be cured using ultraviolet light, heat, or the like.

The apparatus 10 can further include an energy source 38 coupled to a direct energy 40 along a path 42. The head 30 and stage 16 can be configured to position the superstrate 18 and substrate 12 in superimposition with the path 42. The apparatus 10 can be regulated by a logic element 54 in communication with the stage 16, head 30, fluid dispense system 32, or source 38, and may operate on a computer readable program, optionally stored in memory 56. The logic element 54 may be a processor (for example, a central processing unit of a microprocessor or microcontroller), a field-programmable gate array (FPGA), an application specific integrated circuit (ASIC), or the like. The processor, FPGA, or ASIC can be within the apparatus. In another embodiment (not illustrated), the logic element can be a computer external to the apparatus 10 and is bidirectionally coupled to the apparatus 10.

Figure 10:
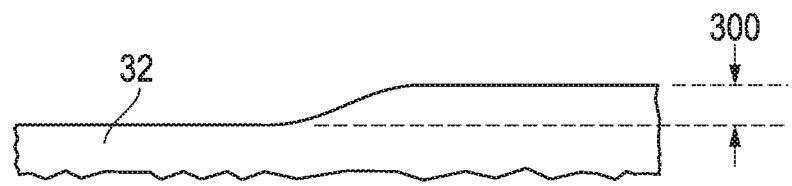
FIG. 10 includes an illustration of a cross-section view of a portion of a substrate having an exposed surface lying at different elevations.
Figure 11:
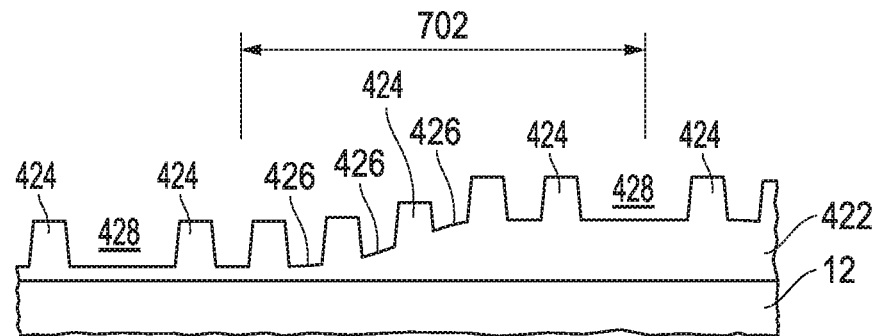
FIG. 11 includes an illustration of a cross-section view of a substrate after forming a patterned resist layer with non-uniform thickness.

Attention is directed to variations of elevation in workpieces and methods of forming an adaptive planarization layer using the superstrate 18 as previously described. Variations in elevation may be attributed to a non-flat substrate, a layer with a varying thickness overlying the substrate, or both. In particular, FIG. 10 illustrates an example of non-flat substrate, and FIG. 11 illustrates an example of non-uniform residual layer thickness formed over a flat substrate. Referring to FIG. 10, a substrate 32 can have an exposed surface that is not perfectly flat. The substrate 32 can have a height difference 300 is typically in a range of 1 nm to 9 nm, with 5 nm being an average for the height difference. Although the height difference appears to be small, such a height difference can be significant, particularly with a reverse tone process. A superstrate, as described below, can be used in an adaptive planarization process to aid in the proper formation of a patterned layer for a reverse tone process.

Referring to FIG. 11, a patterned resist layer can be formed over the substrate 12. A resist precursor material is dispensed over the substrate 12. A template having a complementary image of the patterned resist layer contacts the resist precursor material. In an embodiment, the template corresponds to an imprint field and has an area of at most 50 cm$^2$. Radiation, such as ultraviolet light, visible light, or the like, is transmitted through the template to polymerizing the resist precursor material to form a patterned resist layer 422. The patterned resist layer 422 can include features illustrated as protrusions 424 and recessions 426 and 428 corresponding to a residual layer having a residual layer thickness (RLT). The protrusions 424 can have a height in a range of 10 nm to 110 nm, with 60 nm being an average value. In this embodiment as illustrated in FIG. 11, the RLT has a varying thickness, such that the difference in thickness of the RLT along the substrate 12 corresponds to the height difference 300 as previously described with respect to FIG. 10. For simplicity, the following description addresses the case with non-uniform residual layer thickness only. This does not limit the description to only flat substrate 12. All the following consideration can be generalized for combination of both flat and non-flat substrate 12, as illustrated in FIG. 10, and uniform and non-uniform RLT, as illustrated in FIG. 11.

Figure 12:
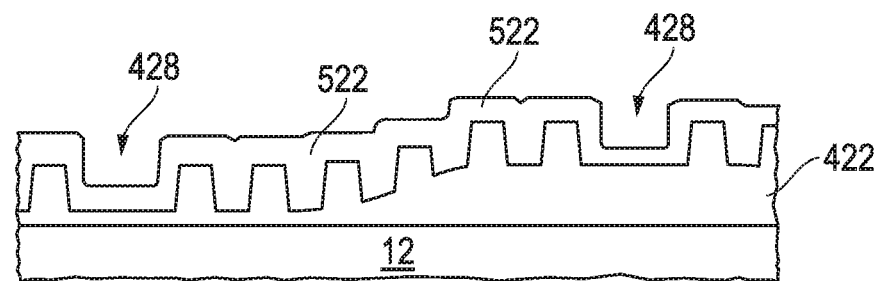
FIG. 12 includes an illustration of a cross-section view of the substrate of FIG. 11 after forming a hardmask layer.

A hardmask layer 522 is formed over the patterned resist layer 422, as illustrated in FIG. 12. The hardmask layer 522 can include a material that can be selectively removed as compared to the patterned resist layer 422 and a subsequently-formed planarization layer. In an embodiment, the hardmask layer 522 can include a silicon oxide, a silicon nitride, or the like. The thickness of the hardmask layer 522 can be in the range of 5 nm to 100 nm and should be uniform. As illustrated in FIG. 12, the hardmask layer 522 fills relatively narrower recessions 426 and does not completely fill relatively wider recessions 428.

Figure 13:
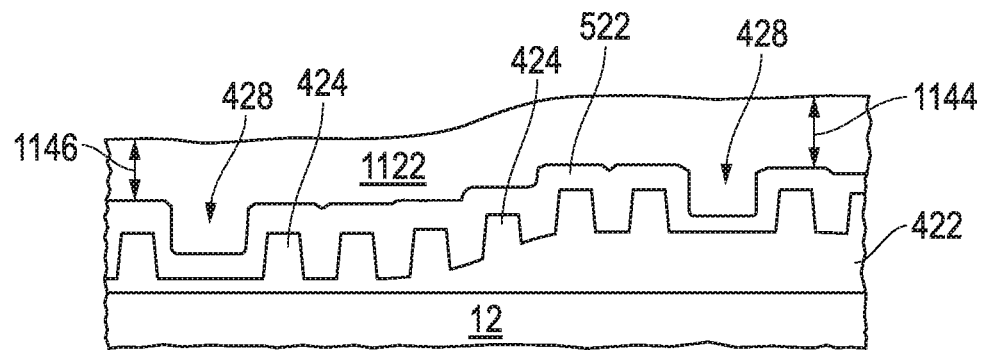
FIG. 13 includes an illustration of a cross-section view of the substrate of FIG. 12 after forming an adaptive planarization layer.
Figure 14:
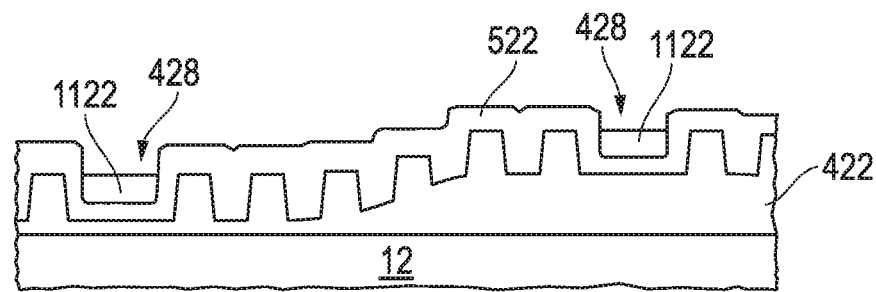
FIG. 14 includes an illustration of a cross-section view of the substrate of FIG. 13 after removing portions of the planarization layer to exposed portions of the hardmask layer.

The method of forming the planarization layer 1122 using the apparatus 10 is described with respect to FIGS. 13 and 14. The method can include dispensing a planarization precursor material 34 over the hardmask layer 522. During subsequent processing, the planarization layer 1122 will be removed selectively as compared to the hardmask layer 522. Thus, the planarization layer 1122 has a different composition as compared to the hardmask layer 522. When the hardmask layer 522 includes an inorganic material, the planarization layer 1122 can include an organic layer. The planarization precursor material 34 can include any of the compounds used in the resist precursor material. The planarization precursor material 34 does not need to meet the patterning requirements for the resist precursor material used in forming the patterned resist layer 422, and therefore, the planarization precursor material 34 can include a material that may not be acceptable for the resist precursor material. Thus, the planarization precursor material 34 and the resist precursor material can be made of the same material or different materials. In a particular embodiment, the planarization precursor material 34 can include a spin-on carbon.

The body 600 of the superstrate 18 has an area that may correspond to an imprint field for the substrate 12 or substantially all or more of the substrate 12. In an embodiment, the area is at least 500 mm$^2$, and in a further embodiment, the area is at least 90% of the substrate 12. In another embodiment, the area of the body 600 has an area that is the same or larger than the substrate 12. In an embodiment, the body has a surface area is at least 700 cm$^2$, at least 1100 cm$^2$, at least 1600 cm$^2$, or larger, and in another embodiment, the surface area may be at most 31,500 cm$^2$.

The superstrate 18 has a transmittance of at least 80%, at least 85%, or at least 90% for radiation used to polymerize the resist precursor material. The superstrate 18 can include a glass-based material, silicon, an organic polymer, a siloxane polymer, a fluorocarbon polymer, a metal, sapphire, spinel, another similar material, or any combination thereof. The glass-based material can include soda lime glass, borosilicate glass, quartz, synthetic fused-silica, or the like. The body 600 can have a thickness as previously described, and such thickness can depend on the material of the body 600 and the height difference. Radiation, such as ultraviolet light, visible light, or the like, is transmitted through the superstrate 18 to polymerize the planarization precursor material 34 to form the planarization layer 1122. As can be seen in FIG. 13, the thickness 1144 of the planarization layer 1122 over relatively higher elevation region and the thickness 1146 of the planarization layer 1122 over relatively lower elevation region are substantially the same value and are more uniform as compared to FIGS. 1 and 2.

The method can further include etching the planarization layer 1122 to expose top portions of hardmask layer 522, as illustrated in FIG. 14. The planarization layer 1122 helps to protect portions of the hardmask layer 522 lying within relatively wider recessions 428. The etchant used for etching the planarization layer 1122 allows the planarization layer 1122 to be removed selectively to the hardmask layer 522. When the planarization layer 1122 includes an organic material and the hardmask layer 522 includes an inorganic material, an oxygen-containing etchant (e.g., $O_2$, $O_3$, $H_2O_2$, or the like) can be used. The etch can be performed as an isotropic or anisotropic etch.

Figure 15:
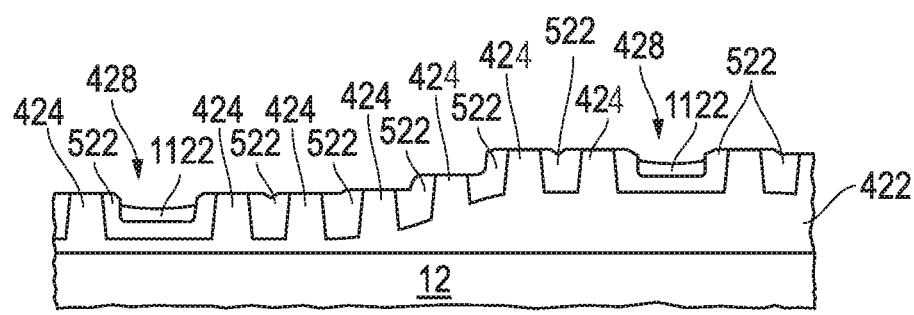
FIG. 15 includes an illustration of a cross-section view of the substrate of FIG. 14 after removing exposed portions of the hardmask layer to exposed portions of the patterned resist layer.

The method can include selectively removing exposed top portions of hardmask layer 522 to expose portions of the patterned resist layer 422, as illustrated in FIG. 15. The portions of the hardmask layer 522 overlying the residual layer of the patterned resist layer 422 are protected by the remaining portions of the planarization layer 1122 within the relatively wider recessions 428. The etchant used for etching the hardmask layer 522 allows the hardmask layer 522 to be etched selectively to the planarization layer 1122 and the patterned resist layer 422. When the hardmask layer 522 includes a silicon oxide, a silicon nitride, or a silicon oxynitride and layers 422 and 1122 includes an organic material, a fluorine-containing etchant (e.g., $CHF_3$, $SF_6$, or the like) can be used. The etch may be performed as an anisotropic etch in order to maintain better the pattern integrity. At this point in the process, the tops of the protrusions 424 of the patterned resist layer 422 at both relatively higher elevations and relatively lower elevations are exposed.

As a point of comparison, reference is made to FIG. 1. If the planarization layer 1122 would have been replaced with a planarization layer having a planar surface, all of such planarization layer within the relatively wider recession in the patterned resist layer 422 at the higher elevation would have been removed, and during the hardmask layer etch, the protected underlying hard mask layer would have become exposed and be prematurely etched away. The latter opens the underlying resist residual layer which, for reference tone processing, should not be exposed at this etch stage. Thus, an acceptable reverse tone image would not be possible when using the planarization layer having the planar surface.

Figure 16:
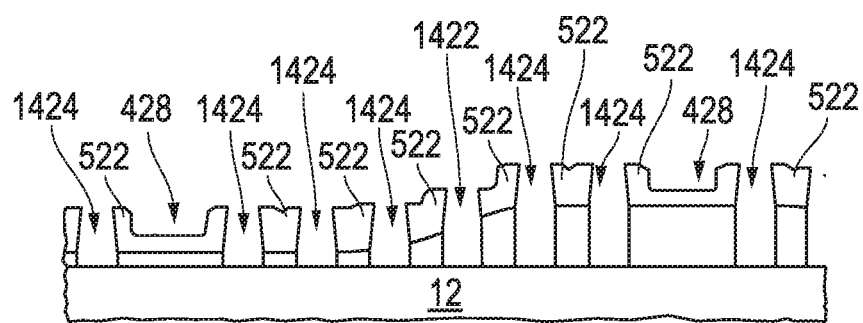
FIG. 16 includes an illustration of a cross-section view of the substrate of FIG. 15 after removing protrusions of the patterned resist layer.

The method can further include etching the exposed portions of patterned resist layer 422, as illustrated in FIG. 16. The protrusions 424 of the patterned resist layer 422 are exposed, and the residual layer under the hardmask layer 522 is not exposed. Thus, the protrusions 424 and residual layer under protrusions 424 are removed to define openings 1424, leaving portions of the residual layer of the patterned resist layer 422 under portions of the hardmask layer 522. When the patterned resist layer 422 includes an organic material and the hardmask layer 522 includes an inorganic material, an oxygen containing etchant (e.g., $O_2$, $O_3$, or the like) can be used. The etch can be performed as an anisotropic etch to maintain pattern integrity. Remaining portions of the planarization layer 1122 within the relatively wider recessions 428 can be removed when the protrusions 424 are removed. The hardmask layer 522 is sufficient to protect the residual layer of the patterned resist layer 422 at the different elevations.

Embodiments as described herein are useful in forming an adaptive planarization layer over a substrate that has a non-uniform topography. A body of a superstrate can be designed to provide bending characteristics that are well suited to achieve both conformal and planarization behavior. Equations provided above can be used to ensure the maximum out-of-plane displacement for conformal behavior is the same or greater than a height difference along a substrate and to provide a range of thicknesses for the particular material of the body. In an embodiment, a thickness can be selected and used to determine $w_{max}$ for conformal behavior is sufficient and that $w_{max}$ for planarization behavior is below a predetermined threshold. The thickness may be adjusted until the values for $w_m$ are acceptable. The length L can be used to determine the bending distance d that can be used in equations to determine the range of thicknesses that can be used. Other techniques, including computer modeling, may be used to determine the range of thicknesses for a body.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A method of fabricating a superstrate for forming a planarization layer on a substrate, the method comprising removing a portion of a material to define a body of the superstrate, wherein the body has a thickness in a range of $t_1$ and $t_2$, and wherein $$t_1 = (Pd^4/2Eh)^{1/3},$$

$$t_2 = (5Pd^4/2Eh)^{1/3},$$

P is a pressure corresponding to a sum of contributions from a capillary force between the body and formable precursor material, and a gas pressure applied to the superstrate, d is a bending distance, E is Young's modulus for the body, wherein $0 < E \leq 70 \times 10^9$ $N/m^2$, h is a maximum out-of-plane displacement in the conformal behavior of the superstrate.

2. The method of claim 1, wherein $t_1$ is between 0.2 mm and 0.95 mm and $t_2$ is between 0.25 mm and 1.1 mm.

3. The method of claim 1, wherein the body includes glass and has a thickness in a range of 0.2 mm to 0.95 mm.

4. The method of claim 1, wherein the body includes polyethylene and has a thickness in a range of 0.25 mm to 1.1 mm.

5. A method of fabricating a superstrate, the method comprising: removing a portion of a material to define a body of the superstrate, wherein the body has a surface and thickness in a range of $t_1$ to $t_2$, wherein:

$$t_1 = (Pd^4/2Eh)^{1/3},$$

$$t_2 = (5Pd^4/2Eh)^{1/3},$$

P is a pressure corresponding to a sum of contributions from a capillary force between the body and formable precursor material, and a gas pressure applied to the superstrate, d is a bending distance, E is Young's modulus for the body, wherein $0<E$, and h is a step height difference between two adjacent regions of a substrate and wherein $t_1$ is between 0.2 mm and 0.95 mm and $t_2$ is between 0.25 mm and 1.1 mm.

6. The method of claim 5, wherein the bending distance is L/2 and wherein L is a length between the two adjacent regions of the substrate.

7. The method of claim 5, wherein d is between 0.1 mm and 2 mm for conformal behavior.

8. The method of claim 5, wherein d is 0.03 mm for planarizing behavior.

9. The method of claim 5, wherein the superstrate has a maximum out-of-plane displacement $w_{max}$ between 5.1 nm to 7 nm for conformal behavior and between $1.5 \times 10^{-3}$ nm to $1.7 \times 10^{-5}$ nm for planarizing behavior.

10. A method of manufacturing an article, the method comprising:

dispensing a planarization precursor material over a substrate, wherein the substrate includes a non-uniform surface topography;

contacting the planarization precursor material with a body of a superstrate, wherein the body has a surface and a thickness in a range of $t_1$ to $t_2$, wherein:

$$t_1 = (Pd^4/2Eh)^{1/3},$$

$$t_2 = (5Pd^4/2Eh)^{1/3},$$

P is a pressure corresponding to a sum of contributions from a capillary force between the body and formable precursor material, and a gas pressure applied to the superstrate, d is a bending distance, E is Young's modulus for the body, wherein $0<E \leq 70 \times 10^9$ N/m$^2$, and h is a step height difference between two adjacent regions of a substrate; and polymerizing the planarization precursor material to form a planarization layer over the substrate, wherein curing is performed while the superstrate is contacting the planarization precursor material.

11. The method of claim 10, further comprising forming a patterned resist layer including protrusions and a residual layer, wherein forming the patterned resist layer is performed before dispensing the planarization precursor material.

12. The method of claim 11, wherein forming the patterned resist layer comprises:

dispensing a resist precursor material;

contacting the resist precursor material with a template; and polymerizing the resist precursor material to form patterned resist layer.

13. The method of claim 12, wherein the template has an area of at most 50 cm$^2$.

14. The method of claim 12, wherein the planarization precursor material and the resist precursor material are different materials.

15. The method of claim 11, further comprising forming a hardmask layer over the patterned resist layer before dispensing the planarization precursor material.

16. The method of claim 15, further comprising etching the planarization layer to expose top portions of hardmask layer.

17. The method of claim 16, further comprising etching exposed top portions of hardmask layer to exposed portions of the patterned resist layer.

18. The method of claim 17, further comprising etching the exposed portions of patterned resist layer.

19. The method of claim 10, wherein the planarization precursor material is a spin-on carbon.

* * * * *

UNITED STATES PATENT AND TRADEMARK OFFICE
CERTIFICATE OF CORRECTION

PATENT NO. : 10,859,913 B2
APPLICATION NO. : 16/737362
DATED : December 8, 2020
INVENTOR(S) : Dwayne L. LaBrake et al.

It is certified that error appears in the above-identified patent and that said Letters Patent is hereby corrected as shown below:

In the Specification

Column 12, Line 6, please delete "for $w_m$ are", and insert --for $w_{max}$ are--

Signed and Sealed this
Fifteenth Day of November, 2022

*Katherine Kelly Vidal*

Katherine Kelly Vidal
*Director of the United States Patent and Trademark Office*